US009671478B2

(12) United States Patent
Driesel et al.

(10) Patent No.: US 9,671,478 B2
(45) Date of Patent: Jun. 6, 2017

(54) ANTENNA AND ANTENNA ARRANGEMENT FOR MAGNETIC RESONANCE APPLICATIONS (75) Inventors: Wolfgang Driesel, Sandersdorf-Brehna (DE); Toralf Mildner, Leipzig (DE); Andreas Schaefer, Leipzig (DE); Harald Moeller, Leipzig (DE)

(73) Assignee: Max-Planck-Gesellschaft zur Foerderung der Wissenschaften e.V., Munich (DE)

( * ) Notice: Subject to any disclaimer, the term of this patent is extended or adjusted under 35 U.S.C. 154(b) by 713 days.

(21) Appl. No.: 14/234,177

(22) PCT Filed: Jul. 22, 2011

(86) PCT No.: PCT/EP2011/003699
§ 371 (c)(1),
(2), (4) Date: Mar. 26, 2014

(87) PCT Pub. No.: WO2013/013680
PCT Pub. Date: Jan. 31, 2013

(65) Prior Publication Data
US 2014/0197832 A1 Jul. 17, 2014

(51) Int. Cl.
*G01V 3/00* (2006.01)
*G01R 33/36* (2006.01)
(Continued)

(52) U.S. Cl.
CPC ............. *G01R 33/36* (2013.01); *H01Q 7/005* (2013.01); *H01Q 7/04* (2013.01)

(58) Field of Classification Search
CPC ........... G01R 33/36; H01Q 7/005; H01Q 7/04
(Continued)

(56) References Cited

U.S. PATENT DOCUMENTS 3,973,263 A    8/1976   Green
4,251,808 A * 2/1981   Lichtblau ................. H01Q 7/04
                                                                                      340/572.7
(Continued)

FOREIGN PATENT DOCUMENTS

EP         0223284 B1    5/1987
EP         0249298 B1   12/1987
(Continued)

OTHER PUBLICATIONS

Ackerman et al., "Mapping of metabolites in whole animals by 31P NMR using surface coils", Nature, vol. 283, pp. 167-170 (1980).
(Continued)

*Primary Examiner* — Susan Lee
(74) *Attorney, Agent, or Firm* — Caesar Rivise, PC (57) ABSTRACT An antenna (100), which is designed for exciting and/or detecting a magnetic resonance in an object (1) under investigation, comprises a conductor loop (10) with an inner conductor (11) and a primary shield conductor (12), which form at least one waveguide, wherein the primary shield conductor (12) is interrupted by a gap (13), and wherein a secondary shield conductor (14) is provided which surrounds the primary shield conductor (12), wherein a dielectric (15) is arranged between the primary shield conductor (12) and the secondary shield conductor (14) and at least the gap is covered by the secondary shield conductor (14). An antenna arrangement which comprises a plurality of such antennas, a magnetic resonance device, and a method for magnetic resonance imaging or magnetic resonance spectroscopy are also described.

27 Claims, 8 Drawing Sheets (51) Int. Cl.
*H01Q 7/00* (2006.01)
*H01Q 7/04* (2006.01)

(58) Field of Classification Search
USPC .......................................................... 324/307
See application file for complete search history.

(56) References Cited

U.S. PATENT DOCUMENTS

| | | | |
|---|---|---|---|
| 4,446,429 A * | 5/1984 | Froncisz | G01R 33/343 |
| | | | 324/316 |
| 4,605,899 A * | 8/1986 | Eumurian | G01R 33/028 |
| | | | 324/258 |
| 4,694,255 A | 9/1987 | Hayes | |
| 4,717,880 A * | 1/1988 | Ono | G01R 33/345 |
| | | | 324/316 |
| 4,746,866 A | 5/1988 | Roeschmann | |
| 4,755,837 A | 7/1988 | Schmidlin et al. | |
| 4,825,162 A | 4/1989 | Roemer et al. | |
| 5,804,969 A | 9/1998 | Lian et al. | |
| 6,847,210 B1 * | 1/2005 | Eydelman | G01R 33/341 |
| | | | 324/318 |
| 6,992,630 B2 * | 1/2006 | Parsche | H01Q 1/38 |
| | | | 343/700 MS |
| 7,663,367 B2 * | 2/2010 | Wiggins | G01R 33/34084 |
| | | | 324/309 |
| 2008/0042648 A1 * | 2/2008 | King | G01R 33/3415 |
| | | | 324/318 |
| 2011/0156705 A1 * | 6/2011 | Chan | G01R 33/3415 |
| | | | 324/318 |

FOREIGN PATENT DOCUMENTS

| | | | |
|---|---|---|---|
| EP | 0256370 A1 | 2/1988 | |
| EP | 0317090 A2 | 5/1989 | |
| EP | 0856907 A1 | 8/1998 | |

OTHER PUBLICATIONS

Bai et al., "Stacked Dual-Band Circularly Polarized Microstrip Patch Antenna", IEEE, pp. 706-709 (2007).

Ferrero et al., "Dual-Band Circularly Polarized Microstrip Antenna for Satellite Applications", IEEE Antennas and Wireless Propagation Letters, vol. 4, pp. 13-15 (2005).

Griswold et al., "Generalized Autocalibrating Partially Parallel Acquisitions (GRAPPA)", Magnetic Resonance in Medicine, vol. 47, pp. 1202-1210 (2002).

Harpen, "The Theory of Shielded Loop Resonators", MRM, vol. 32, pp. 785-788 (1994)

Heckler et al., "Dual-Band Circularly Polarzed Microstrip Antenna with Two Isolated Outputs Suitable for Navigation Systems", Antennas and Propagation Society International Symposium, Apsursi, IEEE Piscataway Symposium, pp. 1-4 (2009).

Hetzer et al., "Shielded Dual-Loop Resonator for Arterial Spin Labeling at the Neck", Journal of Magnetic Resonance Imaging, vol. 29, pp. 1414-1424 (2009).

Hoult, "The NMR Receiver: A Description and Analysis of Design", Progress in NMR Spectroscopy, vol. 12, pp. 41-77 (1978).

Katscher et al., "Transmit SENSE", Magnetic Resonance in Medicine, vol. 49, pp. 144-150 (2003).

Mispelter et al., NMR Probeheads for Biophysical and Biomedical Experiments, pp. 430-435 (Imperial College Press 2006).

Pozar, et al., "A Dual-Band Circularly Polarized Aperture-Coupled Stacked Microstrip Antenna for Global Positioning Satellite", IEEE Transaction on Antennas and Propagation, vol. 45, No. 11, pp. 1618-1625 (1997).

Pruessman et al., "SENSE: Sensitivity Encoding for Fast MRI", Magnetic Resonance in Medicine, vol. 42, pp. 952-962 (1999).

Roemer et al., "The NMR Phased Array", Magnetic Resonance in Medicine, vol. 16, pp. 192-225 (1990).

Stensgaard, "Optimized Design of the Shielded-Loop Resonator", Journal of Magnetic Resonance, Series A, vol. 122, No. 0187, pp. 120-125 (1996).

Tang et al., "Studies of RF Shimming Techniques with Minimization of RF Power Deposition and Their Associated Temperature Changes", Magnetic Resonance in Engineering, vol. 39B, pp. 11-25 (2011).

Vaughan et al., "High Frequency Volume Coils for Clinical NMR Imaging and Spectroscopy", Magnetic Resonance in Medicine, vol. 32, pp. 206-218 (1994).

Zabel et al., "High-Quality MR Imaging with Flexible Transmission Line Resonators", Radiology, vol. 165, pp. 857-859 (1987).

Abstract of EP 0256370, Feb. 1988.

International Search Report for PCT/EP2011/003699 dated Jul. 2, 2012.

* cited by examiner

ABSTRACT
ANTENNA AND ANTENNA ARRANGEMENT FOR MAGNETIC RESONANCE APPLICATIONS

The invention concerns an antenna, which is adapted for exciting and/or detecting a magnetic resonance (MR) in an object to be examined. The invention also relates to an antenna arrangement (antenna array) for an MR-device and to a method of operating the MR device and methods of operating of an MR device, in particular methods for magnetic resonance imaging or magnetic resonance spectroscopy. The invention can be used in particular in the magnetic resonance imaging (MR imaging; also magnetic resonance tomography, MRT, or magnetic resonance imaging, MRI) and in the magnetic resonance spectroscopy (MR spectroscopy).

PRIOR ART

In the following, reference is made to the publications listed below, for illustrating the prior art, in particular as regards the MRI or MR spectroscopy.
[1] D. I. Hoult. The NMR receiver: a description and analysis of design. Prog. NMR Spectr. 12: 41-77 (1978).
[2] H. J. Zabel, R. Bader, J. Gehring, W. J. Lorenz. High-quality MR imaging with flexible transmission line resonators. Radiology 165: 857-859 (1987).
[3] M. D. Harpen. The Theory of shielded loop resonators. Magn. Reson. Med. 32: 785-788 (1994).
[4] A. Stensgaard. Optimized design of the shielded-loop resonator. J. Magn. Reson. A 122: 120-125 (1996).
[5] S. Hetzer, T. Mildner, W. Driesel, M. Weder, H. E. Moller. Shielded dual-loop resonator for arterial spin labeling at the neck. J. Magn. Reson. Imaging 29: 1414-1424 (2009).
[6] EP 223 284 B1.
[7] EP 249 298 B1.
[8] J. T. Vaughan, H. P. Hetherington, J. O. Otu, J. W. Pan, G. M. Pohost. High frequency volume coils for clinical NMR imaging and spectroscopy. Magn. Reson. Med. 32: 206-218 (1994).
[9] K. P. Pruessmann, M. Weiger, M. B. Scheidegger, P. Boesiger. SENSE: sensitivity encoding for fast MRI. Magn. Reson. Med. 42: 952-962 (1999).
[10] M. A. Griswold, P. M. Jakob, R. M. Heidemann, M. Nittka, V. Jellus, J. Wang, B. Kiefer, A. Haase. Generalized autocalibrating partially parallel acquisitions (GRAPPA). Magn. Reson. Med. 47: 1202-1210 (2002).
[11] L. Tang, Y. K. Hue, T. S. Ibrahim. Studies of RF shimming techniques with minimization of RF power deposition and their associated temperature changes. Concepts Magn. Reson. Part B (Magn. Reson. Engineering) 39B: 11-25 (2011).
[12] U. Katscher, P. Bornert, C. Leussler, J. S. van den Brink. Transmit SENSE. Magn. Reson. Med. 49: 144-150 (2003).

The measurement of the magnetic nuclear resonance has become established, in particular in the medicine, as an imaging and analysis method. This method makes use of the fact that magnetic nuclear moments in the static magnetic field can be deflected when a magnetic alternating field of a defined frequency is radiated. The frequency (Larmor frequency) is determined by the strength of the static magnetic field, $B_0$, and the gyromagnetic constant of the atom nuclei examined. The nuclear moments which precede coherently as a result of the excitation generate a magnetic induction signal which can be registered by suitable coils (also designated antennas) and can be used for the reconstruction of an image. Basically, the same antennas can be used both for excitation, i.e. transmitting a high-frequency (HF) signal, and for receiving. Antennas and antenna arrangements with a plurality of constructional forms are known, which differ from one another with respect to the geometric design, the ability to be tuned to the desired Larmor frequency, the signal-to-noise ratio (SNR), the field of view (FOV), the geometry, and in particular the homogeneity of the antenna field.

With an HF antenna (volume or surface antenna), in addition to the high-frequency magnetic field ($B_{HF}$ field), which is important for the nuclear resonance, a high-frequency electric field ($E_{HF}$ field) is also generated. The $E_{HF}$ field generated by capacitors or coupling to the $B_{HF}$ field is conservative (i.e. a potential energy can be defined). With reference to the nuclear resonance, the $E_{HF}$ field has undesirable impacts. So it leads among other things to a load-dependent tuning and adapting behavior, to coupling between individual coils of an antenna arrangement, to radiation loss and to warming of the object to be examined. The last point is of particular relevance under safety aspects, for the medical MR imaging and MR spectroscopy due to the risk of exceeding limit values of specific absorption rate (SAR). Early efforts to reduce the unwanted $E_{HF}$ field to a value as low as possible (e.g. through a symmetrical excitation or the use of a so-called high current probe) have proved adverse at higher frequencies with respect to the production and the tuning and adaptation behavior of the antenna.

To reduce the $E_{HF}$ field, it was also suggested to apply loop antennas made of coaxial conductors with MR methods [1-5]. These antennas, whose structure is known from the radio technology, are also called "magnetic antennas" because of the primary detection of the $B_{HF}$ field. Conventional magnetic antennas are characterized by a symmetrical structure, and can be fed in a very stable manner without a balun and sheath wave locking device over a coaxial cable. Another characteristic is a high quality factor of the coil, which, however, results for transmitting antennas, due to the associated resonance enhancement, in high currents and voltages and requires the use of suitably robust components.

For a magnetic antenna, the smaller the size of the antenna compared to the wavelength, the more the magnetic field component will predominate over the electric field component. The loop made of a coaxial conductor acts as a coil and forms together with a tunable capacitor a resonant circuit of high quality. For the following reasons, conventional magnetic antennas have, however, the disadvantage that they cannot be tuned at higher frequencies with a capacitor and, therefore, their application is limited to the radio technology in the shortwave and VHF range.

To allow tuning of the conventional magnetic antenna by a capacitor, the circumference of the loop must be less than ¼ of the minimum cable wavelength. This is e.g. fulfilled in the arrangement described by Hetzer et al. [5] for 125 MHz (Larmor frequency of hydrogen nuclei or "protons" in a static magnetic field of 2.94 T), because here the circumference (taking into account the connection cables) corresponds to approx. 0.16λ (coil diameter 6 cm, length of the connecting conductors to the tuning unit approx. 3 cm, i.e. total cable length approx. 24.8 cm). The wavelength however decreases with increasing frequencies, so that above certain limits, a suitable constructive size of tunable antenna is no longer possible. Thus, the circumference for equal sizing corresponds to approx. 0.37λ at 297.2 MHz (Larmor frequency for protons at 6.98 T), and the antenna of the conventional design made of semi-rigid cables is no longer tunable with a capacitor to the Larmor frequency. Therefore, the person skilled in the art would assume just after a rough estimate that no tuning would be possible above approx. 200 MHz (Larmor frequency for protons at 4.70 T).

As an alternative to the capacitor tuning, Roschmann et al. [6, 7] suggested to use the capacitance and inductance coating of coaxial conductors for tuning purposes. Vaughan et al. [8] took up this idea and proposed the implementation of volume coils (so-called TEM resonators) according to the "transmission-line principle". These antennas are indeed adjustable at higher frequencies. However, setting up and partly also the tuning are significantly more complicated.

OBJECTIVE OF THE INVENTION

The objective of the invention is to provide an improved antenna with the shape of a loop antenna (or: magnetic antenna) by means of which disadvantages of conventional antennas are reduced or avoided. In particular, the invention is based on the objective of providing an antenna for an MR device, which at a given geometry—especially for frequencies when operating MRI devices—is tunable with a capacitor and enables a robust operation by simple tuning. Furthermore, the objective of the invention is to provide an improved antenna arrangement by means of which disadvantages of conventional antenna arrangements, in particular as regards a coupling between antennas via the $E_{HF}$ field or sheath waves, are reduced or avoided. Also, the objective of the invention is to provide an improved MR device that is equipped with a loop antenna or magnetic antenna. Finally, it is also the objective of the invention to provide an improved method of operating the antenna or antenna arrangement. The method should enable in particular a more robust operation of an MR device.

SUMMARY OF THE INVENTION

This objective is achieved by an antenna, an antenna arrangement, an MR device and a method with the features of the independent claims, resp. Advantageous embodiments and applications of the invention result from the dependent claims.

According to a first aspect of the invention, the above objective is achieved by the general technical teaching of providing an antenna, in particular for an MR device, which is adapted for excitation of a magnetic resonance and/or receiving of a magnetic resonance signal in an object to be examined and which forms a loop antenna. The antenna according to the invention comprises a conductor loop with an inner conductor and a primary shielding conductor (outer conductor), forming at least one waveguide with a predetermined loop shape. Feed points of the antenna are preferably located at the ends of the conductor loop. The conductor loop is connected to at least one of the feed points with at least one tuning capacitor (tune capacitor), preferably at least one variable tuning capacitor. The primary shielding conductor is interrupted by a gap at least one point along the course or circumference of the conductor loop (circumferential or longitudinal direction of the conductor loop). The gap, which is also indicated as separating slit or slit, extends transversely with respect to the circumferential direction of the conductor loop so that the primary shielding conductor in the azimuthal direction (circumferential direction of the waveguide transverse to the circumferential direction) is completely interrupted.

Furthermore, the antenna according to the invention comprises a secondary shielding conductor, which is located in the area of the at least one gap and covers it. The secondary shielding conductor surrounds the primary shielding conductor, wherein an electrically insulating material (dielectric) is arranged between the two shielding conductors. Preferably, the secondary shielding conductor surrounds the primary shielding conductor on all sides so that the at least one gap is completely covered in the azimuthal direction.

The inventors could ascertain by simulations and the development of a prototype that the antenna according to the invention could surprisingly be tuned through the at least one tuning capacitor also when the length of the conductor loop (circumference of the loop antenna) is greater than a quarter of the wavelength that is excitable in the waveguide. The tuning ability with the tuning capacitor is achieved by covering of the at least one gap by the secondary shielding conductor. Another important advantage of the antenna according to the invention is that it is characterized, compared to conventional waveguide-based loop antennas, by a larger tuning range.

Advantageously, the antenna according to the invention forms a waveguide, which is tunable in a resonant manner to at least one Larmor frequency with the at least one tuning capacitor or optionally (in the case of tuning to several Larmor frequencies) with additional tank circuits. The function of the antenna according to the invention is based on the fact in accordance with the conductor theory that waveguides transform reactances according to the well-known transformation formulas, and that currents flow out in the area of the at least one gap in the waveguide, which currents flow out through the primary shielding conductor towards the feed points. As a result, the primary shielding conductor acts as an additional inductance, connected in series with respect to the waveguide, which inductance is partly bridged in a capacitive manner by the secondary shielding conductor provided according to the invention. Thus, compared to conventional magnetic antennas or loop antennas, the tuning range is extended towards higher frequencies, and hence beyond the limits defined by λ/4 for conventional loop antennas.

As another advantage over conventional loop antennas, $E_{HF}$ fields are reduced in the area of the object to be examined by the secondary shielding of the antenna according to the invention, which is of particular importance under the above mentioned aspects and in particular safety aspects. At the same time, an insensitivity to electromagnetic fields in the environment is achieved. Furthermore, it is worth noting that this insensitivity to electrical fields advantageously causes a reduced reception of noise from noise sources of the environment so that the SNR is improved. Finally, this also causes a reduced coupling to neighboring loop antennas according to the invention, so that a use of an antenna arrangement according to the invention as an array is advantageous. Finally, further advantages of the antenna according to the invention consist in the fact that it can be produced in a simple and cost-effective manner.

Advantageously, there are different variants of the waveguide design. For example, the primary shielding conductor can have one single gap that is preferably arranged symmetrically with respect to the feed points of the antenna, e.g. at half length of the conductor loop. In this case, the secondary shielding conductor is preferably also arranged symmetrically in the circumferential direction of the conductor loop with respect to the feed points, and sections of equal length of the primary shielding conductor remain uncovered by the secondary shielding conductor. The symmetrical arrangement of the gap with respect to the feed points can have advantages as regards the suppression of sheath waves in the waveguide, which could otherwise be suppressed by optionally provided baluns and/or sheath wave locking devices.

The primary shielding conductor can optionally have multiple gaps. Preferably, the gaps for a symmetrical structure of the antenna are arranged in an evenly distributed manner in the circumferential direction of the conductor loop with respect to the feed points. If multiple gaps are provided, the secondary shielding conductor covers at least one of the gaps. It can be provided that one single gap of the plurality of gaps, a set of gaps, or all gaps are covered by the secondary shielding conductor. The secondary shielding conductor can extend along the length of the conductor loop over the gaps or be composed of multiple, separate sections of the secondary shielding conductor (secondary shielding conductor sections), which each cover one or more of the gaps.

Alternatively, a non-symmetrical arrangement of the gap or the gaps is possible, which may have advantages for the targeted influencing of the field distribution of the antenna according to the invention, e.g. to modify an inhomogeneous spreading of the $B_{HF}$ field in the tissue, which might be advantageous particularly with high magnetic field intensities.

According to further preferred embodiments of the invention, the secondary shielding conductor has at least one of the following features. Preferably the secondary shielding conductor is arranged symmetrically with respect to the at least one gap, i.e. the lengths of the secondary shielding conductor that cover the primary shielding conductor on both sides of the gap, are equal. Advantageously, this improves the uniformity of the magnetic field generated by the antenna according to the invention. Furthermore, the secondary shielding conductor can completely surround the waveguide in the azimuthal direction in the area of the gap.

This can be advantageous for the above mentioned capacitive bridging function of the secondary shielding conductor. Alternatively, the secondary shielding conductor can have an interruption, such as a slit, in the circumferential direction of the conductor loop. Advantages can result for the suppression of eddy currents in this case. Furthermore, the secondary shielding conductor can have a shape of a sleeve. In this case, the secondary shielding conductor is formed with a closed surface, e.g. from a sheet of metal or a metal foil. Alternatively, the secondary shielding conductor can have a surface with interruptions, e.g. with a network or spiral shape. The selection of one of these variants can be advantageous for the optimization of the mentioned capacitive bridging function of the secondary shielding conductor. Furthermore, the network or spiral shape can also be advantageous for the suppression of eddy currents.

The function of the secondary shielding conductor provided according to the invention can advantageously be influenced depending on its electrical connection with the primary shielding conductor. For example, according to a first variant, the secondary shielding conductor can have a free potential ("floating"). According to other variants, which can be provided either individually or in combination, the dielectric between the primary shielding conductor and the secondary shielding conductor can be bridged by at least one capacitance, at least one inductance or at least one diode.

In addition to the simplicity of the construction of the antenna, another advantage of the invention consists in the variability in the selection and arrangement of the conductor loop. The conductor loop can be formed according to a preferred variant of the invention by one single ring (e.g. circular or elliptical) or one single polygon (e.g. a rectangle or a rhombus) and extend in a plane or along a curved surface. Further possible formations, which deviate from the classic conductor form and which have shapes deviating from a rectangular shape or circular shape are expressly incorporated into the invention.

According to a modified variant, the conductor loop can form at least two rings and/or polygons, which form one single resonant circuit and extend in a common plane or can be arranged inclined relative to each other, e.g. perpendicularly or at another angle. If the rings and/or polygons are separately excitable and form a plurality of resonant circuits, an antenna arrangement is created (see below).

According to further modified variants, the conductor loop can have a crossing or intersection of the waveguide. For example, the conductor loop can have a form corresponding to the numeral eight. Advantages for forming the antenna characteristic can result with these variants.

According to a particularly preferred embodiment of the invention, the conductor loop comprises a coaxial cable, the ends of which form the feed points of the antenna. Advantageously, manufacturing the antenna is facilitated by using a flexible coaxial cable. The inner conductor of the coaxial cable forms the inner conductor of the antenna, while the outer conductor of the coaxial cable forms the primary shielding conductor. Preferably, the at least one gap in the primary shielding conductor is arranged symmetrically with respect to the feed points. The coaxial cable carries on the surface of the outer conductor, i.e. on the primary shielding conductor, an insulator layer, which provides the dielectric between the primary and secondary shielding conductors of the antenna according to the invention. The secondary shielding conductor is formed by an electrically conductive coating, e.g. made of a metal, such as copper, silver, gold or aluminum, or of a metal alloy, such as brass or German silver, or of a metal-graphite composite on the insulator layer.

The choice of the thickness and the type of the dielectric between the primary shielding conductor and the secondary shielding conductor and the overlapping area by the secondary shielding conductor influences the extension of the tuning range towards higher frequencies (in particular beyond the limit defined in conventional loop antennas by $\lambda/4$). The length of the secondary shielding conductor can be selected freely in particular depending on the conditions in the production of the antenna and the setting of a desired resonant frequency of the antenna. According to a preferred embodiment of the invention, it is however provided that the secondary shielding conductor has in the circumferential direction of the conductor loop a length, which is at least the triple width of the covered gap.

Particularly preferably, adjustability of the secondary shielding conductor is provided for. In this variant, the length of the secondary shielding conductor in the circumferential direction of the conductor loop is variable. To this effect, the secondary shielding conductor can comprise, for example, two shielding conductor sections that are connected together electrically and can be shifted relative to each other. For example, the secondary shielding conductor may be formed by two sliding metal sleeves, wherein the length of the secondary shield conductor depends on the mutual position of the overlapped metal sleeves.

For the production and function of the antenna according to the invention, it has proved advantageous if the thickness of the dielectric between the primary and secondary shielding conductors is at least 10 μm, preferably at least 50 μm.

Preferred materials for the dielectric are polyolefines such as, for example, polyethylene or polypropylene. In this case, advantages result for the production of the dielectric, for example by shrinking of a hose. Alternatively, polytetrafluoroethylene (PTFE) or phenolic resins or, with appropriate supporting of the secondary shielding conductor, an inert gas, air or vacuum can be used as the dielectric. According to a further alternative, the dielectric can comprise a metal oxide, such as e.g. aluminium oxide or titanium dioxide, a mineral, a ceramic or glass. Advantages for the production of the dielectric can result in this case from application of a metal oxide paste.

According to a further preferred embodiment of the invention, the antenna comprises a tuning device, which includes the at least one tuning capacitor and by means of which the antenna can be tuned to at least one Larmor frequency. Advantageously, the antenna according to the invention can thus easily be adapted to various MR-examination tasks, e.g. to the measurement of a specific atom nucleus or various atom nuclei. There is a high degree of variability in the configuration of the tuning device which can be adapted e.g. for tuning various parts (individual resonators) of an antenna arrangement according to the invention (see below) to different Larmor frequencies or for tuning predetermined parts of an antenna or antenna arrangement according to the invention to several Larmor frequencies. The tuning device can comprise a network of reactances (capacitances and/or inductances) which is connected to the antenna according to the invention. Preferably, the tuning device is electromagnetically shielded, e.g. arranged in a housing at ground potential.

The flexibility of the adaptation to various measurement conditions can be advantageously increased if the antenna according to a further embodiment of the invention has a switching device by means of which the antenna is connected to the tuning device, and by means of which the sensitivity of the antenna can be varied. Therefore, in dependence upon the specific application or the specific position of the region of interest in the object, it can be necessary to open conductor loops according to the invention partially or completely, to detune them or optionally to short-circuit them. PIN diodes (positive intrinsic negative diodes) are particularly preferably used for this purpose, if necessary in combination with capacitance diodes (Varactor diodes) and/or further reactances. Advantageously, a remote control of the switching device is thereby also permitted.

If a loop antenna according to the invention is to be opened, then a suitably dimensioned inductance is connected in parallel with a voltage-proof capacitor (e.g. the tuning capacitor) in the resonance circuit by means of a control DC voltage with a PIN-diode. The connectable inductance is dimensioned in such a manner that together with the selected capacitor it forms a parallel resonance circuit at the desired frequency.

If a loop antenna according to the invention is to be detuned, then a suitably dimensioned capacitance (or even a capacitor diode) is connected in parallel or optionally in series with the tuning capacitor in the resonance circuit by means of a control DC voltage with a PIN-diode. The connectable capacitance is dimensioned in such a manner that it tunes the resonance circuit to the desired new frequency. The controlled detuning can be useful as an intermediate stage for optimizing sensitivity profiles in specific applications (HF shimming, local excitation, local reception).

If, however, a loop antenna according to the invention is to be short-circuited, the easiest way to achieve this is that, using a control DC voltage, a conductively switched PIN diode bridges the feed and terminal connection of the loop antenna.

Advantageously, the antenna according to the invention can be formed exclusively as a transmitting antenna. In this case, the loop antenna and the remaining structure are designed for the voltages in the kilovolt range occurring when sending. The antenna or antenna arrangement according to the invention can also be connected in the transmission scenario to the transmitter via at least one tuning capacitor or a tuning network and a matching arrangement. Alternatively, the antenna according to the invention can be formed exclusively as a receiving antenna. In this case, the loop antenna or antenna arrangement according to the invention are designed for the voltages in the millivolt range occurring when receiving and connected to a pre-amplifier.

However, in a preferred manner the antenna or antenna arrangement according to the invention is formed as a transmitting/receiving antenna. In this case, each loop antenna according to the invention can be coupled either to a receiver or a transmitter of the MR device via a change-over switch. Owing to its function, the change-over switch is also indicated as a T/R-change-over switch ("transmitter/receiver" change-over switch).

In summary, three measures are available to adjust the antenna according to the invention to at least one Larmor frequency, which measures can be realized individually or in combination. These measures comprise dimensioning of the at least one tuning capacitor, adjusting a length of the secondary shielding conductor along the course of the conductor loop and adjusting of a capacitive and/or inductive coupling of the secondary shielding conductor with the primary shielding conductor. The adjustment can be predetermined with the manufacture of the antenna, or it may be provided that the adjustment of the finished antenna is varied e.g. between different operation phases.

According to a second aspect of the invention, the above objective is achieved by the general technical teaching of providing an antenna arrangement, which comprises a plurality of antennas according to the invention. The antenna arrangement is a group of antennas which are combined to form a field (array). It is used to generate and receive alternating magnetic fields in the near field, in particular for use in MR imaging and MR spectroscopy. It is suitable in particular in the case of transmission for the local excitation of limited areas or for the homogenization of the excitation in particular when examining biological tissues at higher frequencies. During the reception of MR-signals, it is characterised by an increase in the SNR in regions near to the coils and/or by accelerated image acquisition.

A further important advantage of the antenna arrangement according to the invention consists in the simple manner in which it is produced. By arranging several antennas according to the invention in a row alongside one another, it is possible to create a three-dimensional array, which can optionally be adapted geometrically to a predetermined shape of the object to be examined, e.g. a body region to be examined (e.g. the head or a joint), and permits a high degree of flexibility in terms of usage.

The arrangement of antennas according to the invention as array allows, in addition to improving the SNR, the application of techniques for the (reception-side) parallel MR imaging (e.g. in the position space according to the "SENSE method" [9] or in the k space according to the "GRAPPA method" [10]. Thus, inter alia, the spatial and/or temporal resolution in the MR experiment can be improved. Furthermore, an arrangement of antennas according to the invention achieves a better homogeneity of the $B_{HF}$ field in the object to be examined (so-called "HF shimming" [11]) with appropriate control over multiple, independent sending channels and allows the application of parallel transmission techniques [12].

An antenna arrangement according to the invention can be composed of individual antennas according to the invention or groups of antennas according to the invention in such a way that the individual antennas or the groups of individual antennas form independent and separately excitable resonant structures (resonant circuits). The antennas, which form an antenna arrangement, can here have different shapes and/or sizes. In particular, an antenna arrangement according to the invention can be realized in such a way that separate antennas according to the invention are arranged at a distance from one another, adjacent or partially overlapping, and thus form an array of individual resonators.

For example, at least two antennas with the shape of rings and/or polygons, which form an antenna arrangement, can be provided for. In this context, the at least two rings and/or polygons can be excited with a phase difference of e.g. 0°, 90° or 180°. In special cases, such as in the examination of biological tissues with relatively high Larmor frequencies (e.g. at 300 MHz), phase differences other than 0°, 90° or 180° can also be advantageous.

The arrangement of antennas according to the invention can be provided for along a straight or curved row of antennas in a one-dimensional manner. In addition, antennas according to the invention (individual resonators) can be arranged perpendicular to the direction of the one-dimensional row repeatedly side by side, so that a two-dimensional array is formed.

The antenna arrangement does not necessarily have to extend spatially along a straight line or a plane but can also extend along a curved line or a polygon line or a curved reference surface. It can be particularly advantageous to operate in quadrature antennas according to the invention that are oriented orthogonal to each other. This leads to a reduction in the required transmission power and to an improved SNR during reception. These advantages are based in particular upon the knowledge that in the case of coils operated in quadrature the required transmission power is halved, and that in the reception scenario the SNR is increased by a factor of 1.4.

With an antenna arrangement, which extends along a curved reference surface, one obtains a three-dimensional array. The geometric shape of the three-dimensional antenna arrangement can also be adapted to the shape of the object to be examined (or the partial areas to be examined of the object to be examined), which leads to optimum conditions both for the irradiation of the HF and also in the reception scenario. In conjunction with the adjustability of the antenna sensitivity, all desired directions and/or amplitudes of the $B_{HF}$ field in the object to be examined can thus be generated (transmit) or detected (receive) in an MR device.

The antennas can be arranged advantageously on a reference surface, which is curved in such a manner that an examination space is formed which is arranged for receiving the object to be examined. The curved reference surface encloses a hollow space, in which the object can be arranged in the MR device.

According to a further modification of the invention, a plurality of antennas according to the invention, optionally with the above variations, can be arranged in a direction perpendicular to the plane of the conductor loop. The antenna arrangements according to the invention form a stack. Advantageously, an additional degree of freedom results in this case, e.g. for differently tuned or decoupled antennas, for the arrangement of individual antennas, as well as a greater density of the array.

According to a third aspect, the above objective of the invention is achieved by the general technical teaching of providing an MR-device which comprises at least one antenna according to the invention and/or at least one antenna arrangement according to the invention.

Preferably, the at least one antenna according to the invention can be arranged in the MR device in such a manner that the antenna sensitivity is at its maximum in the radial direction relative to the static magnetic field of the MR device, wherein advantages can be achieved with respect to a high degree of sensitivity of the MR examination. Alternatively, the elements of an antenna arrangement according to the invention can be arranged in a twisted manner (i.e. along a helix) with respect to the direction of the static magnetic field. A compromise between a high sensitivity (detection of a high-frequency nuclear induction signal in a direction perpendicular to the axis of the static magnetic field), as well as an advantageous use of parallel imaging techniques (e.g. improvement of the spatial resolution in the direction of the axis of the static magnetic field) can be obtained by tilting the elements of an antenna arrangement according to the invention relative to the static magnetic field.

According to a fourth aspect, the above objective of the invention is achieved by the general technical teaching of providing a method for MR-imaging or MR-spectroscopy on an object which is to be examined, in which an excitation and/or detection of a magnetic resonance in the object is provided by at least one antenna according to the invention and/or at least one antenna arrangement according to the invention. The method is characterized in particular by improved handling of the at least one antenna and thus allows optimization of the examination.

The method according to the invention furthermore allows that the antenna or antenna arrangement is used as a transmitting antenna, a receiving antenna or as a transmitting-receiving antenna or in alternating operation or for a transmission-side or reception-side parallel imaging technique or a combination of both methods.

BRIEF DESCRIPTION OF THE DRAWINGS

Further details and advantages of the invention are described hereinafter with reference to the accompanying drawings. The figures show as follows.

PREFERRED EMBODIMENTS OF THE INVENTION

Embodiments of the invention are described in the following with exemplary reference to antennas, whose conductor loop comprises at least one loop made of a coaxial waveguide with at least one gap and an additional secondary shielding conductor over the at least one gap. The implementation of the invention is not restricted to the illustrated examples, but can be accomplished in a corresponding manner with loop arrangements which comprise differently formed loops and/or other forms of waveguides.

Furthermore, the invention is described hereinafter with reference by way of example to antennas, which extend along a planar reference surface (reference plane). Correspondingly, the invention can be implemented with curved reference surfaces. Although the feed points of the antenna are illustrated at the ends of the conductor loop, the feed points can alternatively be provided in other sections of the waveguide of an antenna.

Finally, it should be noted that the capacitance values stated below represent example values which in the practical application can be adapted to the specific circumstances in particular in dependence upon the loading of the antennas with biological tissues. The person skilled in the art can use the example values as starting values, in order to achieve values for a specific application after simulation calculations, which are known per se, and fine-tuning, for example while using a network analyzer. For simulation calculations, e.g. the software HFSS™ (High Frequency Structure Simulator; Manufacturer: Ansys, Inc., Canonsburg, Pa., USA) can be used in combination with the software Ansoft Designer™ (Manufacturer: Ansys, Inc.).

FIGS. 1A and 1B schematically illustrate embodiments of the antenna 100 according to the invention. In both cases, the antenna 100 respectively comprises a conductor loop 10 with an inner conductor 11 and a primary shielding conductor 12 that form a waveguide. The primary shielding conductor 12 has a gap 13, which is covered by a secondary shielding conductor 14. Between the primary and secondary shielding conductors 12, 14, there is a dielectric 15. The feed points 16 of antenna 100 are formed by the ends of the waveguide.

The feed points 16 are connected to two tuning capacitors 21.1 and 21.2 ($C_T$) that form termination capacitors and are arranged in a shielded housing 24 of a tuning device 20. The tuning device 20 furthermore contains a matching capacitor 22 ($C_M$), which is connected via a shielded cable 23 with a high-frequency generator (not represented). Low-loss ceramic capacitors are usually used as the capacitors 21.1, 21.2, 22. The tuning device 20 thus serves for coupling-in and release of HF power. As an alternative to the illustrated capacitive coupling of the antenna 10 according to the invention, other coupling variants are possible.

The conductor loop 10 of antenna 100 is made of coaxial conductor as short as possible (weak $E_{HF}$ field), which encloses an area as large as possible. The embodiment of FIG. 1A uses therefore a circular loop. For constructive reasons, it might also make sense to use an elliptical shape, a rectangular shape (see FIG. 1B) or other polygons. The waveguide can be manufactured from a non-magnetic semi-rigid cable (solid sheath cable). Preferably, the conductor has a surface as large as possible, because due to the skin effect at the Larmor frequencies that are usual in MR imaging, only the outermost layer of the conductor contributes substantially to the conductivity. For example, coaxial cables (commercially available semi-rigid cables) with a radius ratio of 3.6 are used for the construction of the antenna 100, because the slightest losses occur in this design. This corresponds to a characteristic impedance of 50Ω. Deviating values can also be used. In the embodiment, the length of the waveguide is approx. 23.8 cm, wherein two connection wires of approximately 2.5 cm each provide connection to the tuning device 20, and the remaining portion was bent to form a circular loop with a diameter of approx. 6 cm. The gap 13 in the primary shielding conductor 12 has a width of 1 mm. It is located at a position that corresponds to half the length of the waveguide (i.e. opposite to the feed points 16).

On the primary shielding conductor 12 of the semi-rigid cable (outer diameter of approx. 3.6 mm), shrink hose (polypropylene) with a wall thickness of 0.5 mm is applied as the dielectric 15. A metallization of self-adhesive copper foil is applied onto this dielectric 15 as the secondary shielding conductor 14 symmetrically with respect to the gap 13. The secondary shielding conductor 14 thus formed bridges in a capacitive manner part of the inductance of the primary shielding conductor 12, so that it shifts the resonant frequency of the antenna 100 compared to the result of the conventional, ordinarily shielded variant, to higher frequencies. In the embodiment of FIG. 1A, the conductor loop 10 is double shielded along a length that roughly corresponds to the half circumference (approx. 9.5 cm) with the secondary shielding conductor 14. This ensures that the antenna 100 can be tuned easily to a frequency of 297.2 MHz with preferably the same values for the tuning capacitors 21.1 and 21.2 of approx. 15 pF. Deviating from these values, another dimensioning is also possible. It is noted that air (or vacuum) can also be provided for as the dielectric.

Figure 10:
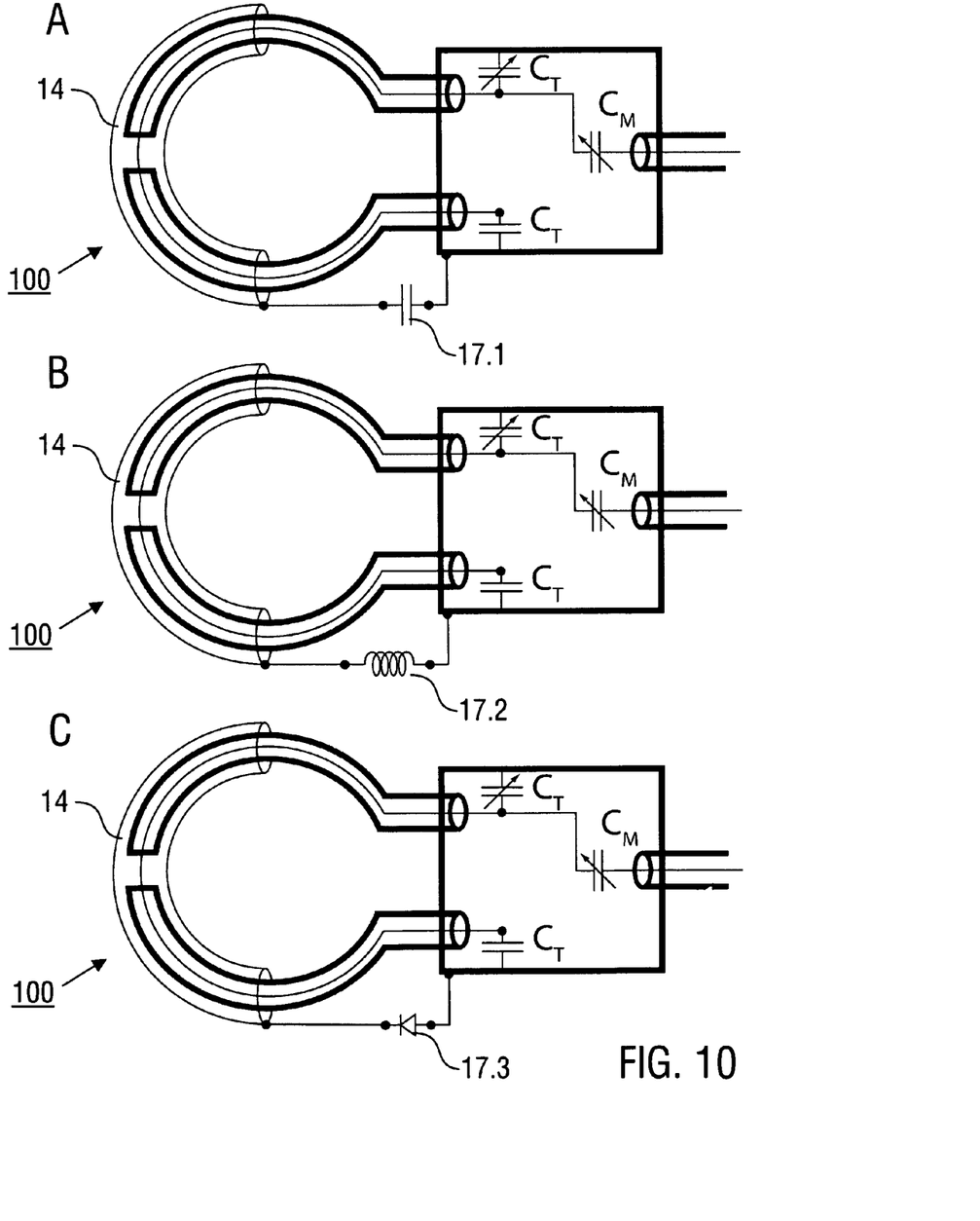

The resonance frequency is chosen according to the Larmor frequency of the investigated atomic nuclei in a static magnetic field of the MR device. It should be noted here that the antenna 100 according to the invention can be tuned to the Larmor frequency for protons in the case of different field strengths, or to the Larmor frequency for other nuclei having a non-zero nuclear spin or for several Larmor frequencies. It should also be noted that in order to fulfill the resonance condition, correspondingly dimensioned, discrete reactances 17.1, 17.2, 17.3 can additionally also be provided at different locations on the antenna 100 according to the invention, e.g. between the primary and secondary shield (see FIG. 10).

The FIGS. 2A, 2B, and 2C schematically illustrate further variants of the antenna 100 according to the invention, each with a circular waveguide, which is formed by the inner conductor 11 and the primary shielding conductor 12.

According to FIG. 2A, one single gap 13 is provided symmetrically with respect to feed points 16, which gap is covered by the secondary shielding conductor 14. In contrast to FIG. 1A, the secondary shielding conductor 14 does not extend over the half conductor loop, but rather over a smaller angle range. According to FIG. 2B, the primary shielding conductor 12 has three gaps, of which only the middle gap is covered by the secondary shielding conductor 14, while two other gaps remain uncovered (open). Finally, FIG. 2C illustrates a variant with three gaps 13 in the primary shielding conductor 12, which are all covered by a common secondary shielding conductor 14.

Figure 2:
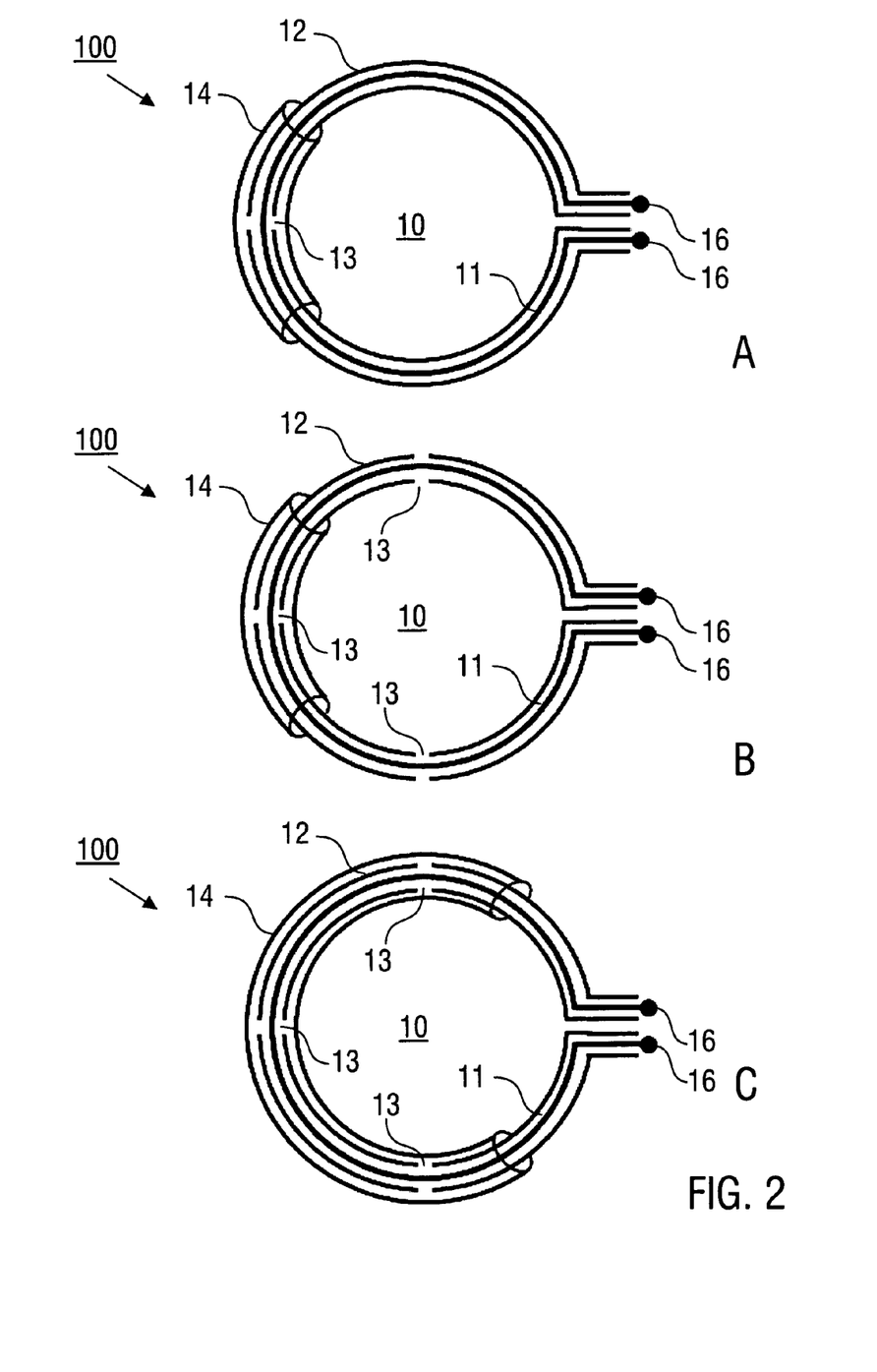
Figure 3:
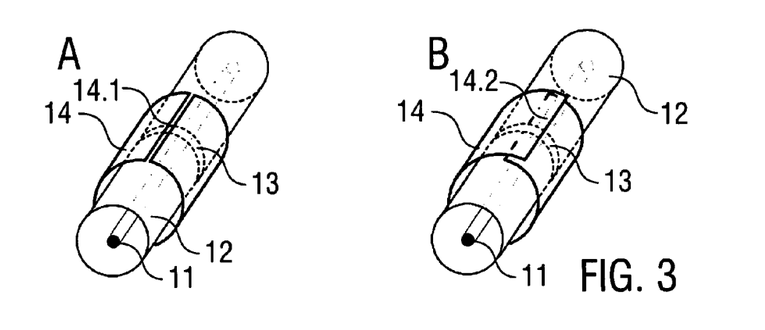

While for the variants according to FIG. 2 the secondary shielding conductor 14 has the shape of a tube or hose and encloses the waveguide of the conductor loop 10 on all sides, the secondary shielding conductor 14 can be formed according to different embodiments of the invention with a longitudinal slit 14.1 (see FIG. 3A) or with an overlapping 14.2 (see FIG. 3B). The longitudinal slit 14.1 extends in the circumferential direction of the waveguide, so that eddy currents are minimized in the secondary shielding conductor 14. In case of overlapping 14.2 according to FIG. 3B, a reduction of eddy currents is also achieved, wherein the shielding of the gap 13 is additionally improved. The variant according to FIG. 3B also allows a spiral arrangement of the secondary shielding conductor 14.

The FIGS. 4 to 8 illustrate embodiments of antenna arrangements 200 according to the invention, wherein at least two antennas according to the invention are arranged side by side (see FIG. 4) or overlapping (see FIGS. 5 to 8) along a curved (see FIGS. 4, 7 and 8) or a plane (see FIGS. 5, 6) reference surface. The antenna arrangements 200 are shown without the tuning devices of the antennas. In the practical implementation of the invention, the tuning devices are each immediately adjacent to the antenna or arranged over shielded cables at a distance from the antenna.

Figure 4:
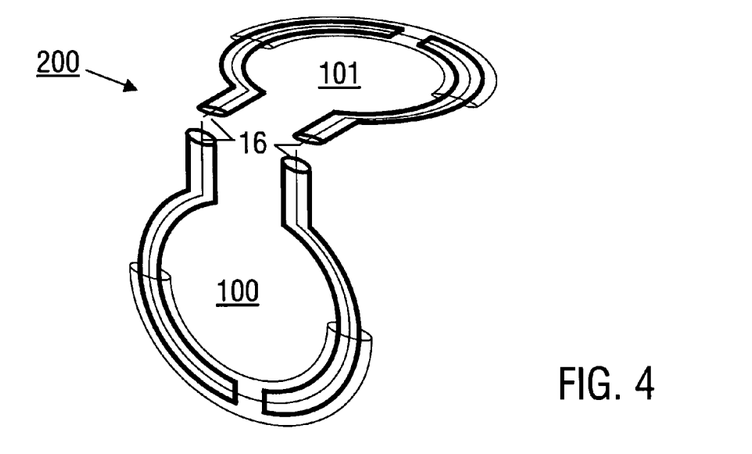
FIGS. 4 to 8: embodiments of antenna arrangements according to the invention.

For the embodiment of the antenna arrangement 200 shown in FIG. 4, two antennas 100, 101 are orthogonal to each other (diameter of e.g. 6 cm each). Each conductor loop of the antennas 100, 101 extends in a reference plane. Both reference planes are perpendicular to each other. The antennas 100, 101 are arranged in such a way that their feed points 16 are arranged adjacent to each other, so that the connection with one or two tuning devices (not shown) is facilitated. The embodiment of FIG. 4 is used e.g. in MR imaging for magnetic marking of arterial blood in the carotid artery of a patient (see [5]). It should be noted, that both antennas 100, 101 according to the invention can alternatively be arranged at a different geometric angle than 90° if deemed advantageous.

The two loop antennas according to the invention can be excited e.g. with a phase difference of 0° (in the sense of a "Maxwell coil") or 90° (in the sense of a "quadrature coil") or 180° (in the sense of a "Helmholtz coil"), so that different $B_{HF}$ fields in the area of the neck arteries, as well as different $E_{HE}$ fields in neck tissues (and thus different local SAR values) are achieved. If necessary, in particular at high Larmor frequencies, where the $B_{HF}$ distribution in the tissue is as known increasingly inhomogeneous, it can be also advantageous to set a distribution as homogenous as possible of the $B_{HF}$ or an amplitude as large as possible of the $B_{HF}$ field in a predetermined target region of the object to be examined with, at the same time, a SAR as low as possible by choosing a phase angle for the control deviating from 0°, 90° or 180°.

Figure 5:
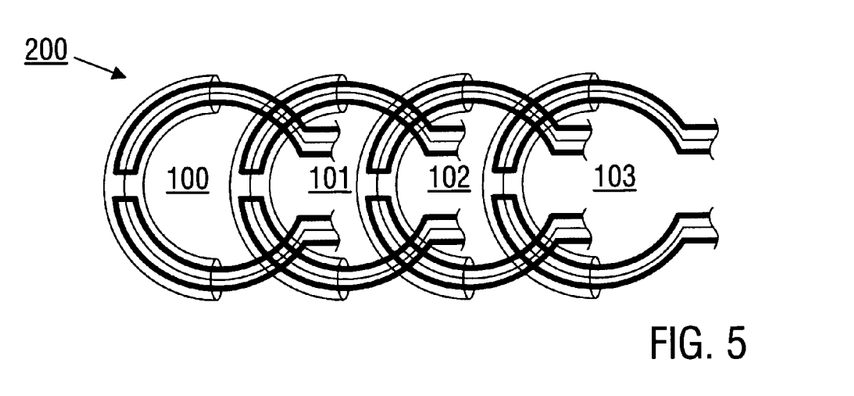

In FIG. 5, a further embodiment of the antenna arrangement 200 according to the invention is schematically illustrated in the form of a series of antennas. It should be emphasized that the embodiment shown in FIG. 5 serves merely for illustrative purposes. The antenna arrangement 200 can comprise at least two or more antennas according to the invention 100, 101, 102, 103, . . . . According to the currently available maximum number of receiving channels of commercially available MR devices, e.g. up to 128 antennas or even more antennas can be provided. The antennas 100, 101, 102, 103, . . . according to the invention must not be arranged as represented in a specific direction, e.g. parallel to the static magnetic field in an MR device. Alternatively, the antennas according to the invention can be arranged in an offset manner and/or at varied spaced intervals.

Figure 6:
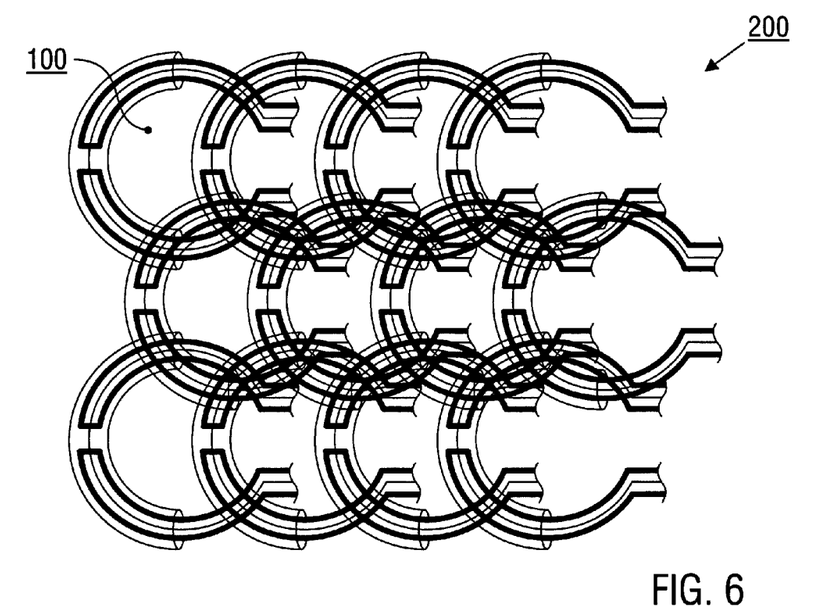

A two-dimensional antenna arrangement 200 is schematically illustrated in FIG. 6, which is composed of antennas 100 according to the invention. The antennas 100 can be constructed the same way or differently. It is thus expressly pointed out that it can be favorable for certain examinations to use inventive antennas of different embodiments in an alternating manner or in a predetermined sequence. According to the invention, the antennas can also be aligned in the direction of a cylinder axis, e.g. in the direction of the static magnetic field $B_0$ of the MR device (z direction). It can, however, also be advantageous for the loop antennas according to the invention to be arranged on a cylinder sheath or an otherwise formed, anatomically adapted molded body at a certain angle with respect to the direction of the static magnetic field (e.g. along a helix). In this case, additional structuring of the transmission/reception profile is achieved in the direction of the static magnetic field.

According to the invention, the arrangement of one or more antennas 100 is also possible in a form adapted to the object to be examined, e.g. dome- or helmet-like for examinations of the head (see FIG. 7), or on the sheath of a cylinder (see FIG. 8) for the examination of the extremities or as an arrangement in one or more flat or curved surfaces for examinations in the area of the body trunk.

Figure 7:
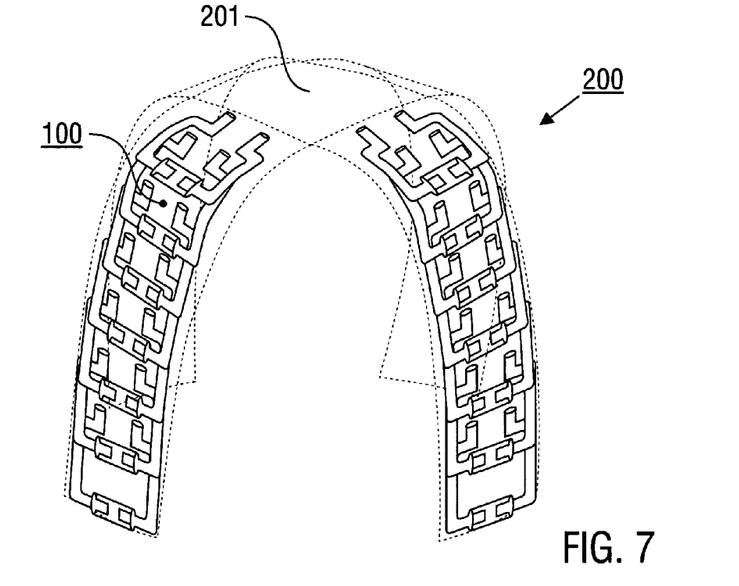

For embodiments according to FIG. 7, at least two rows of adjacent, spaced or overlapping antennas 100 are provided for, which extend in the operating condition of the antenna arrangement 200 on a curved reference surface. The reference surface has a concave form, open on one side, so that a space 2 is created for accommodating the object to be examined (not shown). The reference surface has e.g. the shape of a hemisphere, a half ellipsoid, or a composition of a cylinder and a section of a sphere or an ellipsoid. The at least two rows of antennas according to the invention extend on the reference surface, from their vertex 201, which is opposite the open side, in various directions. Preferably, the rows of antennas 100 are evenly distributed on the reference surface and arranged e.g. star- or crosswise. In practice, a mount of the antennas 100 is formed by a carrier, e.g. made of a plastic material, on the inner and/or outer surface of which the antennas 100 are fixed. The carrier has the shape of the reference surface, or it comprises strips for holding the rows of antennas. In addition, the carrier can accommodate the tuning device(s) of the antennas 100, e.g. on the vertex 201 of the reference surface.

Figure 8:
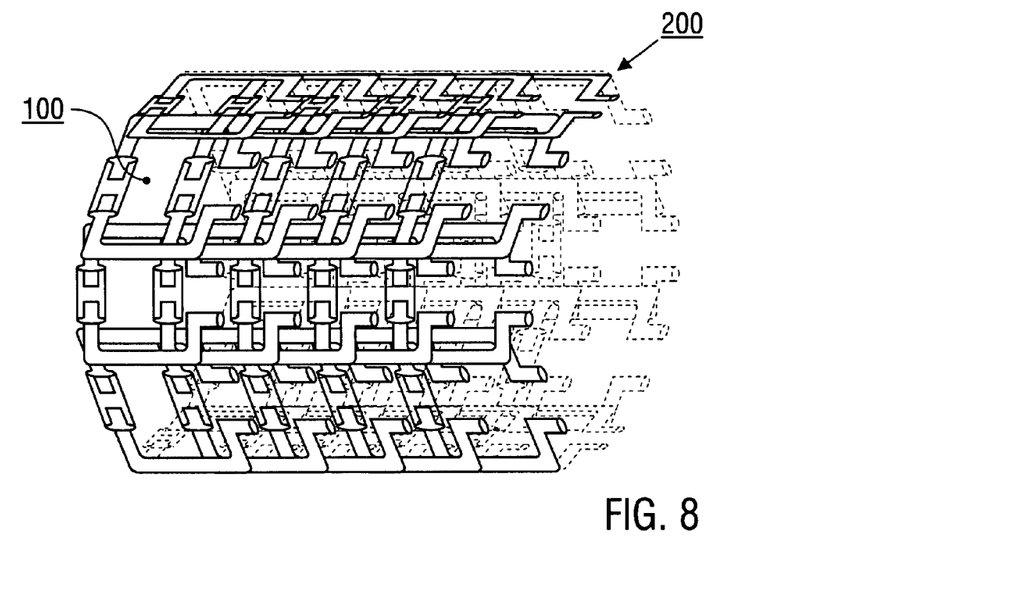

For the embodiments according to FIG. 8, an antenna arrangement 200 having a plurality of rows of antennas 100 according to the invention is created, which array is arranged on a reference surface in the shape of a cylinder adjacent, spaced or overlapping in the axial and/or azimuthal direction. Also in this case a carrier (not shown), e.g. from a plastic material, is provided for, on the inner and/or outer surface of which the antennas 100 are arranged and that can advantageously also accommodate the tuning device(s) of the antennas 100.

Figure 9:
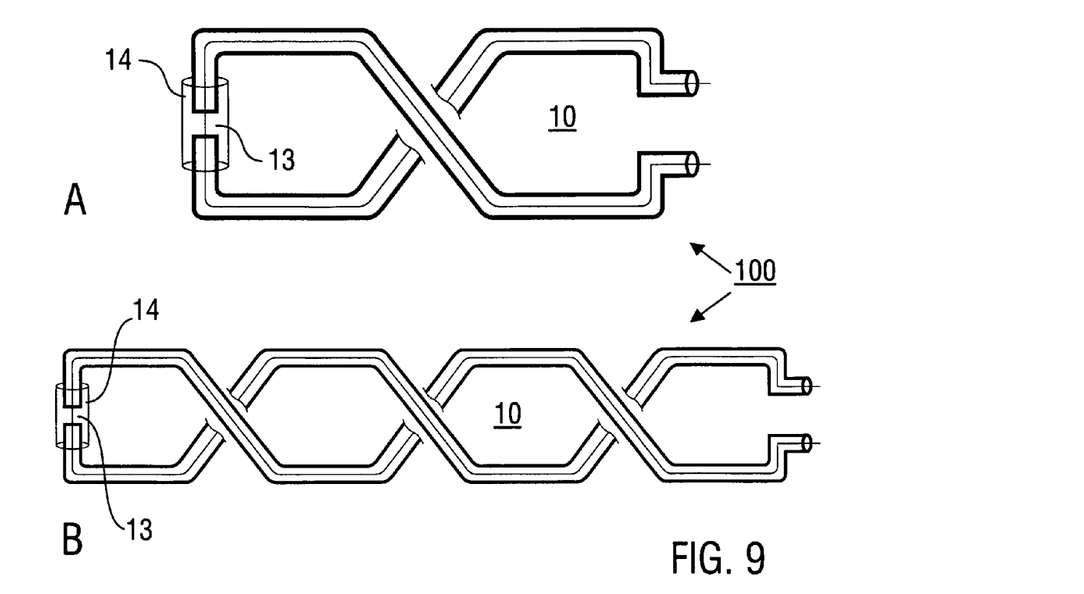
FIGS. 9 to 11: further embodiments of antennas according to the invention.

A further embodiment of an antenna 100 according to the invention is illustrated in FIG. 9A, wherein the waveguide of the conductor loop 10 is arranged so that two rectangular conductor sections twisted by 180° against each other result and the entire arrangement forms a geometric shape according to the numeral "8". The gap 13 and the secondary shielding conductor 14 are provided for in one of the conductor sections. In addition to this arrangement consisting of two circular conductor sections, it can prove advantageous for some applications to construct an otherwise analogous antenna in the form of the numeral "8" consisting of two circles, two ellipses, or two differently shaped polygon lines.

In an analogous manner, three or more circular, elliptical, rectangular loops or loops formed by other polygon lines can be combined, so that a chain made of sections that are each twisted by 180° against each other is formed, and the whole arrangement has a geometric shape according to an n-fold numeral "8" in the longitudinal direction (n=1, 3/2, 2, . . . ). As an example, FIG. 9B shows an arrangement corresponding to a "double eight".

It should be noted that single antennas 100 according to the invention or groups of antennas according to the invention can be tuned to different Larmor frequencies by means of techniques known per se. The tuning state can also be designed to be switchable, if necessary, using fast switching diodes. However, for tuning the loop antennas, it is also feasible to use networks, which consist e.g. of a parallel oscillating circuit (tank) and a series-connected capacitor, and to allow simultaneous tuning to several Larmor frequencies.

Figure 1:
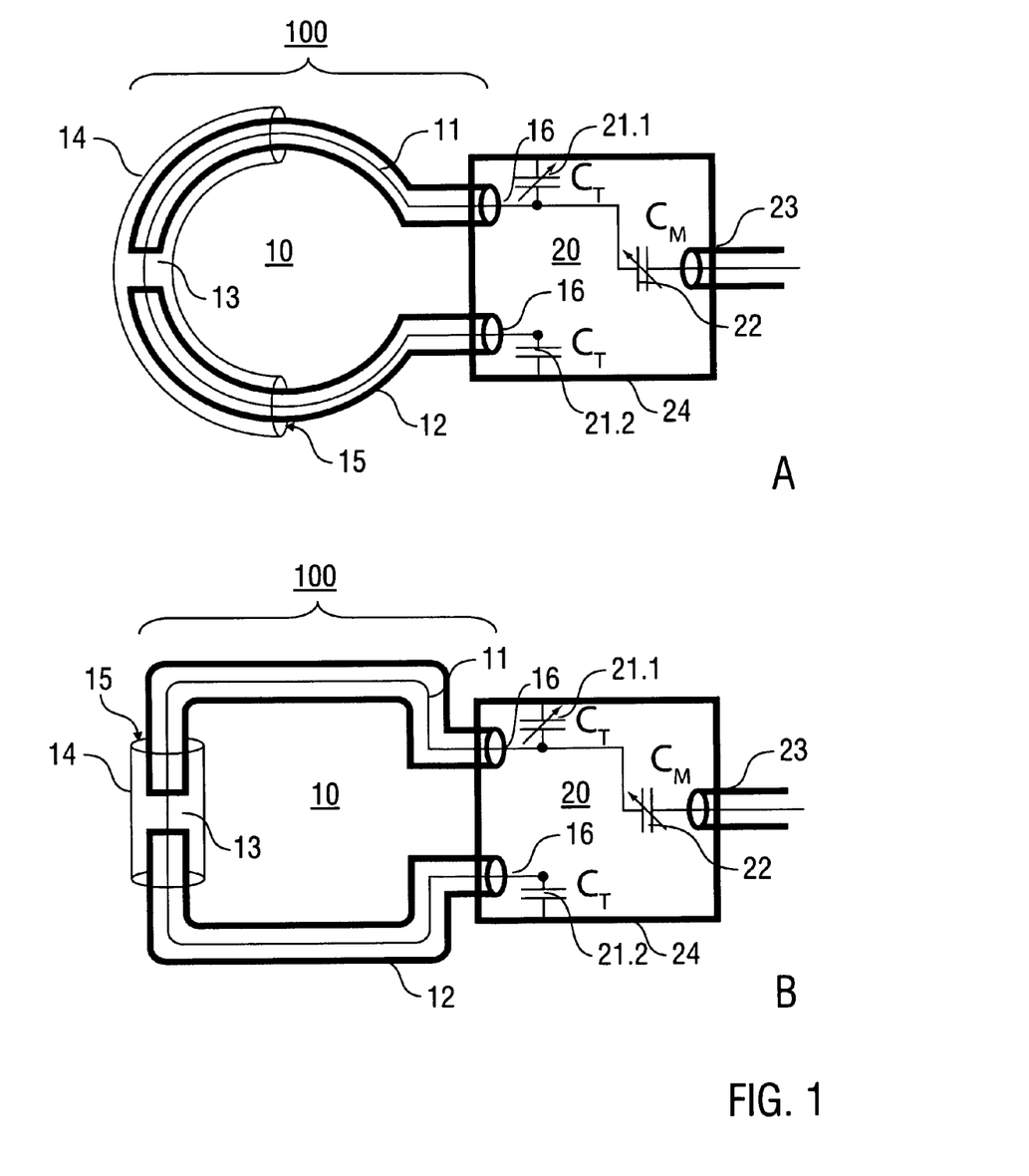
FIGS. 1 to 3: embodiments of antennas according to the invention.

The FIGS. 10A and 10B show exemplarily, as shown in FIG. 1, embodiments of antennas 100 according to the invention, wherein a capacitor 17.1 (FIG. 10A) or an inductance 17.2 (FIG. 10B) switches the secondary shielding conductor 14 against ground potential. FIG. 10C shows exemplarily an embodiment, wherein the secondary shielding conductor 14 of an antenna 100 according to the invention is switched via a diode 17.3 against ground potential.

Figure 11:
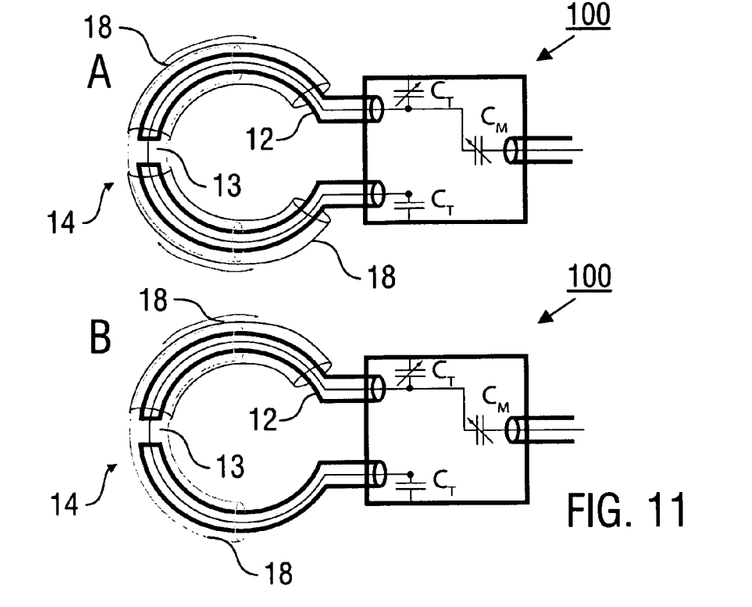

According to the invention, the secondary shielding conductor 14 can be designed in such a way that the tuning of the antenna 100 to a Larmor frequency can be adjusted by varying its extension. Thus, for the embodiments of FIG. 11, two or more tubular shielding sections 18 of the secondary shielding conductor 14 are arranged overlapping and are also connected in a conductive manner, e.g. by a sliding contact. Through mechanical variation of the relative position of the shielding sections 18, the resulting shielding conductor 14 is extended or shortened either in one direction (FIG. 11B) or in two directions (FIG. 11A) on one side or two sides. Depending on the type of MR experiment, the extension or shortening can be symmetrical or non-symmetrical with reference to the gap 13 in the primary shielding conductor of the waveguide. Besides setting a desired tuning behavior, this can also influence the spatial distribution of the $B_{HF}$- and $E_{HF}$ fields in the object to be examined.

Figure 12:
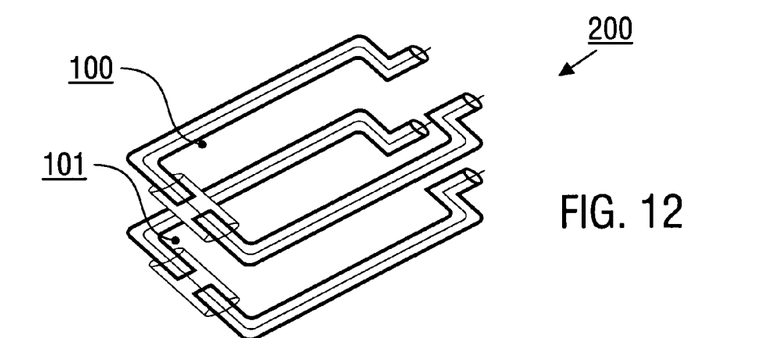
FIGS. 12 to 14: further embodiments of antenna arrangements according to the invention.
Figure 13:
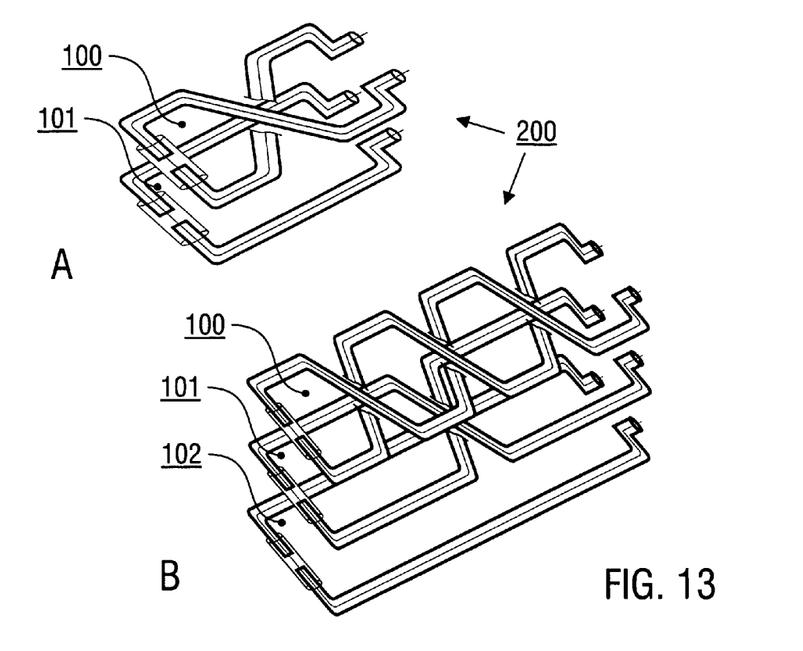

The FIGS. 12 and 13 schematically illustrate embodiments of antenna arrangements 200 according to the invention, wherein antennas 100, 101, 102 according to the invention are arranged stackwise. Depending on the specific application, two antennas 100, 101, as shown, or alternatively a larger number of antennas can be combined. Furthermore, depending on the desired antenna characteristic (antenna sensitivity), two or more similar (FIG. 12) or two or more different (FIGS. 13A and 13B) antennas 100, 101, 102 can be combined.

Figure 14:
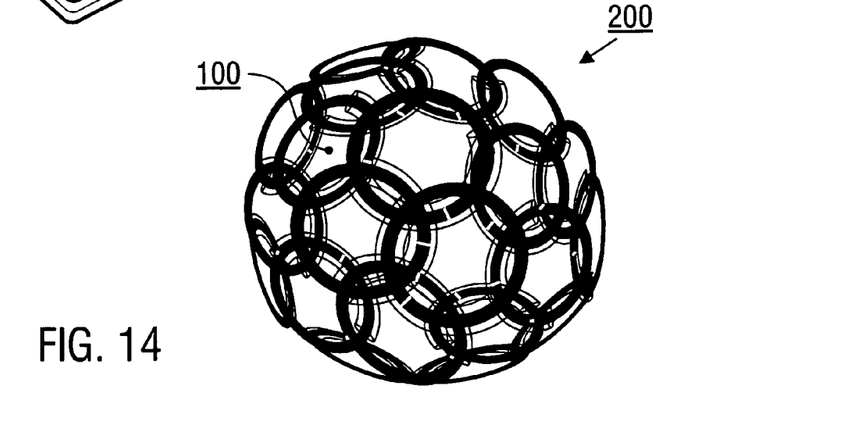

FIG. 14 illustrates exemplarily, in schematic top view, the combination of a plurality of antennas 100 according to the invention arranged overlapping on a spherical reference surface. The antennas 100 can each be connected individually or in groups with separate tuning devices, in order to set, depending on the examined object, specifically the antenna characteristic of the antenna arrangement 200 and/or the resonance frequencies.

Figure 15:
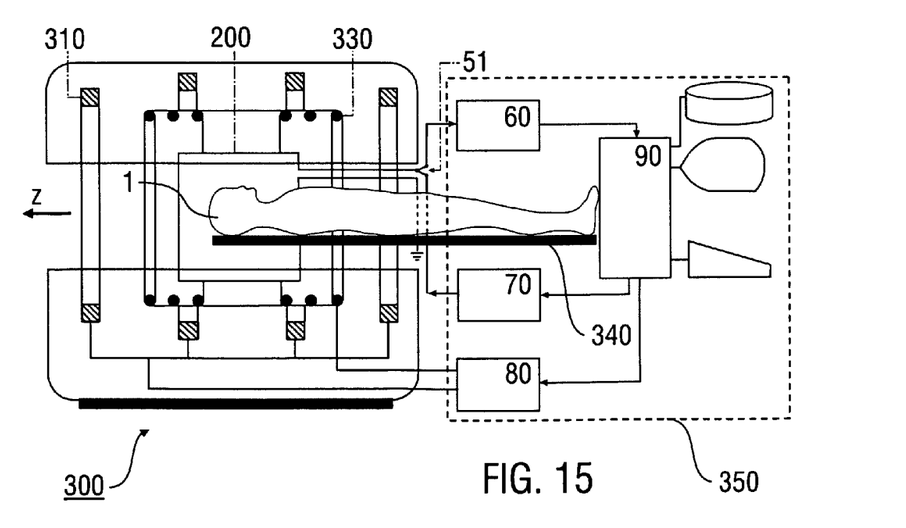
FIG. 15: a schematic illustration of a preferred embodiment of an MR device according to the invention having an antenna arrangement.

FIG. 15 illustrates in a schematic sectional view a preferred embodiment of an MR device 300 according to the invention, which comprises at least one antenna or antenna arrangement 200 according to the invention. Apart from the antenna or antenna arrangement 200, the MR device 300 is constructed substantially in the manner of a conventional MR device. It comprises a main coil 310 which is arranged for the generation of the static magnetic field $B_0$ in the z-direction, the transmitting/receiving coil 200, which is formed by at least one antenna 100 or antenna arrangement according to the invention, at least one gradient coil 330, which is provided for local encoding of the signals, a sample carrier 340, which is arranged to accommodate the object 1 to be examined (e.g. a human body or parts thereof), and a control unit 350 whose components are provided in particular for the control, energy supply, data acquisition and operation of the MR device 300. The control unit 350 comprises in particular a high-frequency receiver and a high-frequency transmitter 70, a power supply 80 and a control computer 90 which is connected to further peripheral devices, e.g. a data storage device, a display device and an operating unit. A change-over switch 51 is provided for the purpose of switching the transmitting/receiving coil 320 (antenna 100) between the transmitting operation and the receiving operation. Multiple change-over switches 51 can also be provided, e.g. for groups of antennas of the antenna arrangement 200 or a plurality of antenna arrangements 200.

The features of the invention disclosed in the above-description, the drawings and in the claims can be significant individually or also in combination for realizing the invention in its various embodiments.

The invention claimed is:

1. An antenna, which is configured for at least one of exciting and detecting a magnetic resonance in an object to be examined, comprising:
   a conductor loop with an inner conductor and a primary shielding conductor that form at least one waveguide, wherein the primary shielding conductor is interrupted by a gap, and
   a secondary shielding conductor, which surrounds the primary shielding conductor, wherein, (i) a dielectric is arranged between the primary shielding conductor and the secondary shielding conductor; (ii) at least the gap is covered by the secondary shielding conductor; and (iii) the secondary shielding conductor has along a circumferential direction of the conductor loop a length, which is at least triple a width of the gap.

2. The antenna according to claim 1, wherein
   the primary shielding conductor is interrupted by several gaps, and
   the secondary shielding conductor covers at least one of the gaps.

3. The antenna according to claim 1, including at least one feature selected from the group consisting of:
   the secondary shielding conductor is arranged symmetrically along the circumferential direction of the conductor loop with respect to the gap,
   the secondary shielding conductor surrounds the at least one waveguide fully or has a slit along the circumferential direction of the conductor loop, and
   the secondary shielding conductor has a sleeve-, network- or spiral shape.

4. The antenna according to claim 1, wherein
   the secondary shielding conductor is connected via at least one member selected from the group consisting of at least one capacitance, at least one inductance and at least one diode with the primary shielding conductor.

5. The antenna according to claim 1, including at least one feature selected from the group consisting of:
   the conductor loop has a circular, elliptic or polygon shape, and
   the conductor loop has a shape according to the numeral eight or half-digit multiplier of the shape according to the numeral eight.

6. The antenna according to claim 5, wherein
   the conductor loop has a rectangular shape.

7. The antenna according to claim 1, wherein
   a length of the secondary shielding conductor is variable.

8. The antenna according to claim 7, wherein
the secondary shielding conductor comprises at least two shielding sections that are connected in an electrically conductive manner and are shiftable relative to one another.

9. The antenna according to claim 1, including at least one feature selected from the group consisting of:
the dielectric has a thickness of at least 10 µm, and
the dielectric is formed by at least one insulator.

10. The antenna according to claim 9, wherein
the dielectric has a thickness of at least 50 µm.

11. The antenna according to claim 9, wherein
the insulator comprises at least one member selected from the group consisting of hydrophobic plastics, a metal oxide, a gas, a ceramic, a glass, a mineral and a vacuum.

12. The antenna according to claim 11, wherein
the hydrophobic plastics comprise at least one member selected from the group consisting of a polyolefin, polytetrafluoroethylene and phenolic resins.

13. The antenna according to claim 1, which comprises at least one member selected from the group consisting of:
a tuning device which is arranged for tuning the antenna to at least one Larmor frequency,
a switching device by use of which a sensitivity of the antenna or an arrangement of a plurality of the antenna can be varied, and
a change-over switch, which is configured for connecting the antenna with a receiver or a transmitter of a magnetic resonance device.

14. The antenna as claimed in claim 13, wherein
the switching device has PIN diodes.

15. The antenna according to claim 1, which is formed exclusively as a sending antenna.

16. The antenna according to claim 1, which is formed exclusively as a receiving antenna.

17. An antenna arrangement, which comprises a plurality of antennas according to claim 1.

18. The antenna arrangement according to claim 17, in which
the antennas are arranged such that at least two conductor loops are overlapping, adjacent to each other, or are at a distance from each other.

19. The antenna arrangement according to claim 17, wherein
the conductor loops have at least one feature selected from the group consisting of different shapes and different sizes.

20. The antenna arrangement according to claim 17, wherein
the antennas are arranged in such a way that the conductor loops extend along a curved reference surface.

21. The antenna arrangement according to claim 17, wherein
the antennas form an antenna stack.

22. A magnetic resonance device, which
is configured to generate a static magnetic field with a predetermined magnetic field direction, and
comprises at least one antenna according to claim 1.

23. The magnetic resonance device according to claim 22, wherein
the at least one antenna is arranged in such a manner that a direction of maximum sensitivity of the antenna is vertical or inclined relative to the magnetic field direction.

24. A method for magnetic resonance imaging or magnetic resonance spectroscopy, including performing at least one step selected from the group consisting of:
exciting a magnetic resonance in an object, which is to be examined, with an antenna according to claim 1, and
detecting the magnetic resonance of the object with the antenna.

25. The method according to claim 24, wherein
the antenna is used: (a) as a transmitting antenna, a receiving antenna or a transmitting-receiving antenna or in alternating operation, or (b) for a transmission-side or reception side parallel imaging technique or a combination of both (a) and (b).

26. The method according to claim 24, wherein
the antenna is tuned by at least one feature selected from the group consisting of setting a length of the secondary shielding conductor along the circumferential direction of the conductor loop and adjusting a capacitive or inductive coupling of the secondary shielding conductor with the primary shielding conductor to a predefined Larmor frequency.

27. The antenna according to claim 1, wherein
the conductor loop comprises a coaxial cable, the ends of which form the feed points of the antenna, wherein
the primary shielding conductor carries an insulator layer, which forms the dielectric, and
the secondary shielding conductor comprises an electrically conductive coating on the insulator layer.

* * * * *